United States Patent [19]
Gardner et al.

[11] Patent Number: 5,918,134
[45] Date of Patent: *Jun. 29, 1999

[54] METHOD OF REDUCING TRANSISTOR CHANNEL LENGTH WITH OXIDATION INHIBITING SPACERS

[75] Inventors: Mark I. Gardner; Fred N. Hause; H. Jim Fulford, Jr., all of Austin, Tex.

[73] Assignee: Advanced Micro Devices, Inc.

[ * ] Notice: This patent issued on a continued prosecution application filed under 37 CFR 1.53(d), and is subject to the twenty year patent term provisions of 35 U.S.C. 154(a)(2).

[21] Appl. No.: 08/666,922

[22] Filed: Jun. 19, 1996

[51] Int. Cl.$^6$ .................................................. H01L 21/266
[52] U.S. Cl. .......................... 438/305; 438/303; 438/307; 438/589; 438/754; 438/756; 438/757; 430/312; 430/314; 430/317; 430/319
[58] Field of Search ..................................... 430/312, 314, 430/317, 319; 438/301, 303, 305, 306, 307, 589, 754, 756, 757

[56] References Cited

U.S. PATENT DOCUMENTS

| | | | |
|---|---|---|---|
| 3,764,423 | 10/1973 | Hauser et al. | 438/756 X |
| 4,471,524 | 9/1984 | Kinsbron et al. | 438/301 X |
| 5,270,234 | 12/1993 | Huang et al. | 438/291 |
| 5,448,094 | 9/1995 | Hsu | 257/330 |
| 5,512,517 | 4/1996 | Bryant | 438/589 X |
| 5,534,456 | 7/1996 | Yuan et al. | 438/303 X |
| 5,552,329 | 9/1996 | Kim et al. | 438/291 |

FOREIGN PATENT DOCUMENTS

| | | | |
|---|---|---|---|
| 44 00 842 | 7/1995 | Germany | H01L 29/772 |

OTHER PUBLICATIONS

International Search Report for PCT/US 97 02491 dated Jun. 20, 1997.

*Primary Examiner*—Bernard Codd
*Attorney, Agent, or Firm*—Kevin L. Daffer; Conley, Rose & Tayon

[57] ABSTRACT

A method of fabricating a transistor. A dielectric layer is formed on an upper surface of a semiconductor substrate. A photoresist layer is then deposited on a dielectric layer and patterned with a photolithography exposure device to expose a region of the dielectric layer having a lateral dimension approximately equal to the minimum feature size resolvable by the photolithography exposure device. The exposed region of the dielectric layer is then removed to form a trench in the dielectric layer having opposed dielectric sidewalls and to expose a channel region of the semiconductor substrate having a lateral dimension approximately equal to the minimum feature size. First and second spacer structures are then formed on the respective dielectric sidewalls. The spacer structures shadow peripheral portions of the exposed channel region. A channel dielectric is then formed between the first and second spacer structures. An outer surface of the spacer structure is then removed to expose peripheral portions of the channel region. A first concentration of a first impurity is then introduced into the peripheral portions of the semiconductor substrate and the channel dielectric is thereafter removed. A gate dielectric is then formed on the semiconductor substrate and a conductive gate structure, such as polysilicon, is formed over the gate dielectric.

20 Claims, 3 Drawing Sheets

METHOD OF REDUCING TRANSISTOR CHANNEL LENGTH WITH OXIDATION INHIBITING SPACERS

BACKGROUND OF THE INVENTION

1. Field of the Invention

This invention relates to the field of semiconductor processing and, more particularly, to a method of forming a transistor having a channel length less than the minimum resolvable feature size of the photolithography exposure device using a dielectric stack and oxidation inhibiting spacers.

2. Description of the Relevant Art

The operating characteristics of transistors fabricated with metal-oxide-semiconductor (MOS) integrated circuit techniques are a function of the transistor's dimensions. In particular, the source-to-drain current ($I_{ds}$) is proportional to the ratio of the transistor's width (W) to the transistor's length (L). For given transistor width and a given biasing condition (e.g. $V_G$=3V, $V_D$=3V, and $V_s$=OV), $I_{ds}$ is maximized by minimizing the transistor length L. Minimizing transistor channel length also improves the speed of integrated circuits comprised of a large number of individual transistors because the larger drain current associated with a short channel length can drive the adjoining transistors into saturation more quickly. Minimizing L is, therefore, desirable from a device operation standpoint. In addition, minimizing the transistor length L is desirable from a manufacturing perspective because a smaller area of silicon is required to manufacture a transistor having a smaller length. By minimizing the area required for a given transistor, the number of transistors available for a given area of silicon increases and with it, a corresponding increase in the circuit complexity that can be achieved on the given area of silicon.

The main limitation of minimum device size in a semiconductor process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleigh's criterion defines two images as being resolvable when the intensity between them drops to 80% of the image intensity. This criterion is satisfied when 2d=0.61λ/NA, where 2d is the separation distance of two images, λ is the wavelength of the energy source, and NA is the numerical aperture of the lens.

Commercially available optical photolithography machines are almost universally equipped with mercury vapor lamps as the illumination source. The characteristic energy spectrum of a mercury vapor lamp contains several distinct peaks in the 300 nm to 450 nm wavelength range. These peaks are commonly referred to by their industry designations. The peak associated with a wavelength of ~450 nm is designated the "G-line," the ~405 nm peak the "H-line," and the ~370 nm peak the "I-line." Photolithography aligners are similarly designated such that it is common to speak of "G-line aligners." The minimum feature size resolvable by a G-line aligner is greater than the minimum feature size of an I-line aligner because of the longer G-line wavelength.

As process technologies approach and surpass the resolvable limits of G-line aligners, semiconductor manufacturers are forced to implement alternative photolithography techniques to achieve adequate resolution of the minimum features. Unfortunately, the conventional alternatives involve abandoning or substantially modifying the existing photolithography equipment at a prohibitive cost. Many wafer fabrication facilities, for example, have extensive capital investment in G-line aligners. To adequately resolve features in the submicron range, it is typically necessary to upgrade these aligners so that they can operate in the I-line region or abandon the optical alignment equipment entirely and replace it with advanced lithography equipment including e-beam or x-ray lithography. The cost associated with replacing or upgrading G-line photolithography equipment can be staggering. In addition to the capital required to purchase and install the improved equipment, there are extensive costs associated with qualifying the new equipment for production worthiness and training production and maintenance personnel in the operation and care of the new equipment. Therefore, it is highly desirable to implement a manufacturing process that can extend the useful life of existing photolithography equipment by permitting the reproducible fabrication of transistors having critical dimensions that are smaller than the minimum resolvable feature of the photolithography equipment.

SUMMARY OF THE INVENTION

The problems noted above are in large part addressed by a method of fabricating transistors in which dielectric spacer structures are used to reduce the dimension of a critical feature below the minimum feature size resolvable by the photolithography equipment. Specifically, the photolithography equipment is used to define a trench in a dielectric layer formed on the surface of the semiconductor substrate. The trench effectively divides the dielectric layer into first and second dielectric structures. The upper surface of the semiconductor substrate comprises the bottom of the trench which forms the channel region of a transistor. In the preferred embodiment, the lateral dimension of the trench is approximately equal to the minimum feature size resolvable by the photolithography equipment.

After the trench is formed, dielectric spacers are formed on the sidewalls of the trench leaving an exposed region of the semiconductor substrate having a lateral dimension which is less than the minimum feature size of the photolithography equipment. In a presently preferred embodiment, the spacer structures have an outer surface comprised of an oxidation inhibiting material such as silicon nitride. A dielectric is then formed in the exposed region of the semiconductor substrate. Next, the oxide inhibiting spacer structure is removed and a first impurity is introduced into the peripheral portions of the channel region exposed after removal of the spacer structures. The first impurity can, in a preferred embodiment of the present invention, comprise the lightly doped drain (LDD) of a transistor or, alternatively, the exterior portions of a source/drain region. By selectively controlling the dimension of the spacer structures, the improved method hereof can effectively reduce the length of a transistor channel region below the minimum dimension resolvable by the photolithography equipment.

Broadly speaking, the invention hereof contemplates a method of fabricating a transistor including providing a semiconductor substrate. The semiconductor substrate includes a channel region laterally displaced between a first source/drain region and a second source/drain region. First and second dielectric structures are formed on the upper surface of the semiconductor substrate such that the dielectric structures are aligned with the first and second source/drain regions respectively. The dielectric structures have substantially vertical sidewalls extending upward from the semiconductor substrate upper surface proximal to the channel region. Thereafter, first and second spacer structures are formed on the vertical sidewalls of the first and second dielectric structures. The spacer structures extend outward from their respective sidewalls to shadow peripheral portions of the channel region proximal to the source/drain regions. A channel dielectric structure is then formed between the first and second spacer structures. In a preferred embodiment, the channel dielectric structure comprises a thermal oxide. After formation of the channel dielectric, the oxidation inhibiting outer surface of the spacer structures is removed to expose peripheral portions of the channel region proximal to the source/drain regions. A first impurity is then introduced into the exposed peripheral portions of the channel region. Next, the channel dielectric is removed and a gate dielectric is formed over the channel region. A conductive gate structure, preferably comprised of polysilicon, is then formed over the gate dielectric after which the first and second dielectric structures are removed to expose the source/drain regions. Thereafter, a second impurity is introduced into the source/drain regions. In a preferred embodiment, introduction of the first and second impurity comprises an ion implantation of an atomic species selected from that group consisting of boron, arsenic, and phosphorus.

The present invention further contemplates a method of fabricating a transistor by providing a semiconductor wafer. A dielectric layer is formed on an upper surface of the semiconductor substrate. A photoresist layer is then deposited on a dielectric layer and a photolithography exposure device capable of resolving a minimum feature size is provided. The photoresist layer is patterned with the photolithography exposure device to expose a region of the dielectric layer having a lateral dimension approximately equal to the minimum feature size. The exposed region of the dielectric layer is then removed forming first and second dielectric sidewalls and exposing a channel region of the semiconductor substrate having a lateral dimension approximately equal to the minimum feature size. First and second spacer structures are then formed on the respective dielectric sidewalls. The spacer structures shadow peripheral portions of the exposed channel region. In a presently preferred embodiment, the spacer structures have an outer surface comprised of an oxidation inhibiting material. A channel dielectric is then formed between the first and second spacer structures. The oxidation inhibiting material of the spacer structure is then removed to expose peripheral portions of the channel region. A first concentration of a first impurity is then introduced into the peripheral portions of the semiconductor substrate and the channel dielectric is thereafter removed. A gate dielectric is then formed on the semiconductor substrate and a conductive gate structure, such as polysilicon, is formed over the gate dielectric.

BRIEF DESCRIPTION OF THE DRAWINGS

Other objects and advantages of the invention will become apparent upon reading the following detailed description and upon reference to the accompanying drawings in which.

Figure 1:
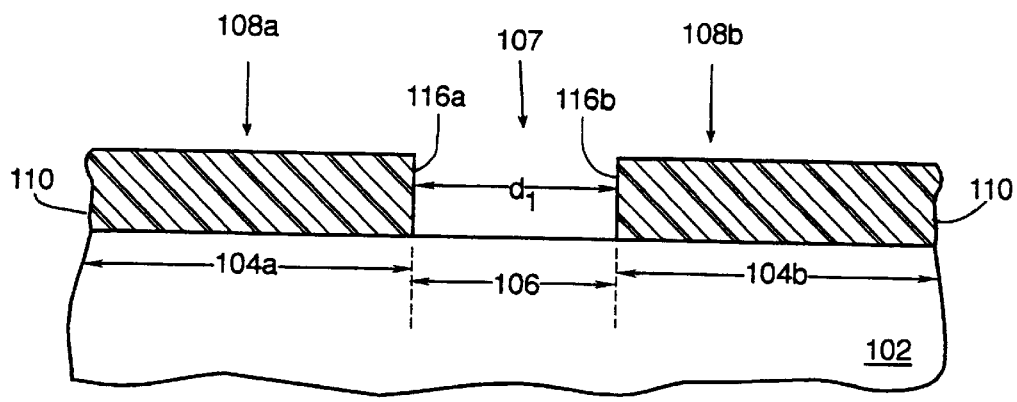
FIG. 1 is a partial cross-sectional view of a semiconductor substrate upon which first and second dielectric structures have been formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1 shows a partial cross-sectional view of a semiconductor substrate 102. Semiconductor substrate 102 includes a channel region 106 laterally interposed between a first source/drain region 104a and second source/drain region 104b. First dielectric structure 108a and second dielectric structure 108b are formed on an upper surface of semiconductor substrate 102. In a presently preferred embodiment, first dielectric structure 108a and second dielectric structure 108b are formed by depositing an oxide layer 110 on semiconductor substrate 102, depositing a photoresist layer on oxide layer 110, patterning the photoresist layer and etching dielectric layer 110 to form a trench 107 in dielectric layer 110. Trench 107 is defined by sidewalls 116a and 116b of dielectric structures 108a and 108b respectively. The floor or bottom of trench 107 comprises an exposed upper surface of channel 106. First dielectric structure 108a and second dielectric structure 108b include sidewalls 116 proximal to channel region 106.

In alternative embodiments, dielectric layer 110 can be comprised of an oxide-nitride-oxide sandwich structure or similar composition of dielectric layers. Sidewalls 116 are substantially perpendicular to an upper surface of semiconductor substrate 102. First dielectric structure 108a, trench 107, and second dielectric structure 108b are formed in vertical alignment with first source/drain region 104a, channel region 106, and second source/drain region 104b respectively. In the presently preferred embodiment, trench 107 is formed with the use of photolithography exposure equipment capable of resolving a minimum feature having a lateral dimension $d_1$. Accordingly, trench 107 and channel region 106 have a lateral dimension $d_1$ that is approximately equal to the minimum resolvable feature size of the photolithography exposure device.

Figure 2:
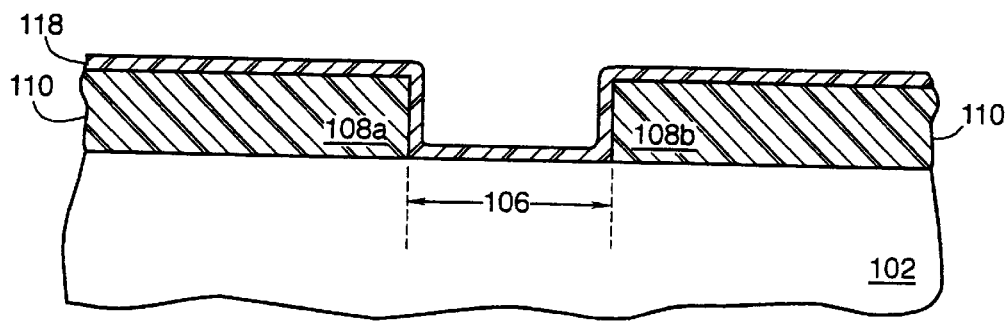
FIG. 2 is a processing step subsequent to FIG. 1 in which a dielectric layer has been deposited on the topography defined by the semiconductor substrate and the first and second dielectric structures.
Figure 3:
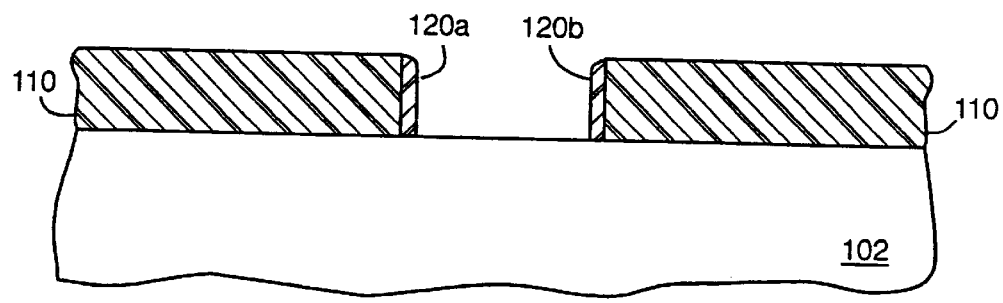
FIG. 3 is a processing step subsequent to FIG. 2 in which the dielectric layer has been anisotropically etched to form a dielectric spacer structure.

Turning now to FIGS. 2–5, a preferred process sequence is shown for forming first spacer structure 125a and second spacer structure 125b (FIG. 5) on the vertical sidewalls 116a and 116b of first dielectric structure 108a and second dielectric structure 108b respectively. In the presently preferred embodiment, each spacer structure 125 includes an outer surface 124 comprising an oxidation inhibiting material. Each spacer structure 125 extends laterally from sidewall 116 of dielectric structure 108 effectively shadowing peripheral portions of channel region 106. Returning to FIG. 2, dielectric layer 118 is formed upon a topology defined by an upper surface of first dielectric structure 108a, second dielectric structure 108b, and an upper surface of channel 106. Dielectric layer 118 is preferably comprised of a chemical vapor deposition ("CVD") oxide formed from a tetraethyl orthosilicate ("TEOS") source as is well known in the art. Turning to FIG. 3, the next step of one embodiment is shown in which dielectric spacer structures 120a and 120b are formed by anisotropically etching dielectric layer 118. The use and formation of spacer structures such as spacer structures 120 is well known in the field of semiconductor processing, particularly with respect to the formation of lightly doped drain (LDD) transistor structures. LDD structures and a process for forming them are described in 3 S. Wolf, "Silicon Processing for the VLSI Era", pp. 591–598 (Lattice Press, 1995).

Figure 4:
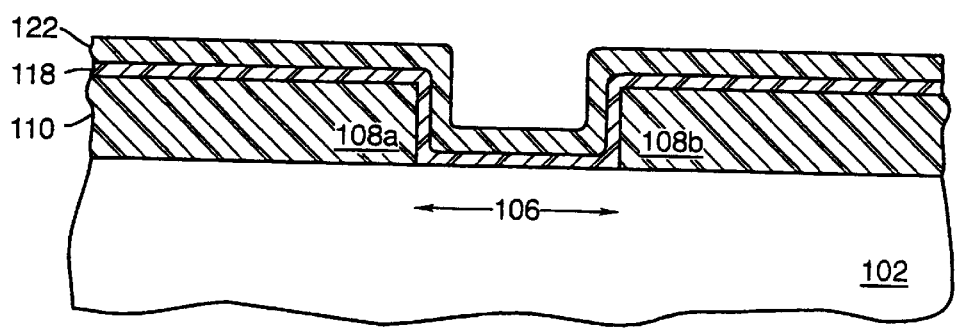
FIG. 4 is a processing step subsequent to FIG. 2 in which an oxidation inhibiting material has been formed on the semiconductor topography.
Figure 5:
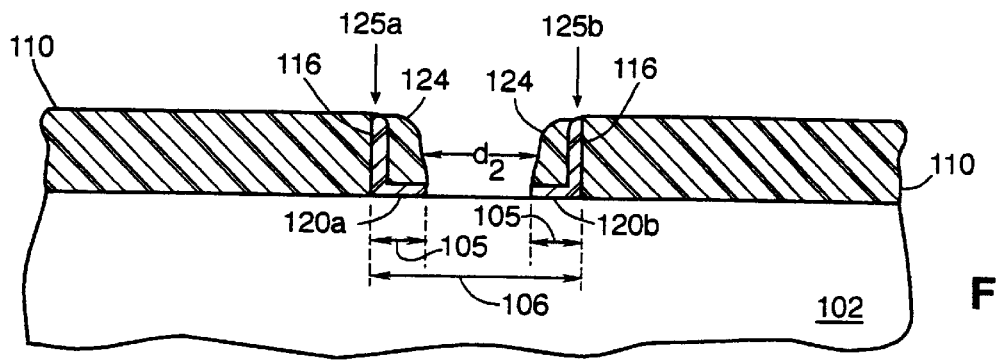
FIG. 5 is a processing step subsequent to FIG. 4 in which the oxidation inhibiting material has been anisotropically etched to form an outer surface on the first and second spacer structures.

Formation of spacer structures 120a and 120b as shown in FIG. 3 exposes the upper surface of semiconductor substrate 102 in channel region 106. Subsequent deposition of silicon nitride is disfavored because the method used to eventually remove the silicon nitride attacks the silicon substrate. Accordingly, in an embodiment in which silicon nitride is used as an oxidation inhibiting material, it is preferable to leave dielectric layer 118 intact so that the silicon nitride layer will not be in direct contact with semiconductor substrate 102. Therefore, the process step shown in FIG. 3 is preferably eliminated in an embodiment in which silicon nitride serves as the oxidation inhibiting material. Turning to FIG. 4, a process step subsequent to FIG. 2 is shown in which dielectric layer 122 is formed on dielectric layer 118. Dielectric layer 122 is preferably comprised of an oxidation inhibiting material such as silicon nitride. The chemical vapor deposition of a silicon nitride layer on a semiconductor surface is well known in the industry. See, e.g., 1 S. Wolf, "Silicon Processing for the VLSI Era" (Lattice Press, 1986), pp. 191–195. Dielectric layer 122 may alternatively comprise silicon-oxynitride layer having a chemical composition $Si_xO_yN_z$. Turning to FIG. 5, spacer structures 125 are completed by anisotropically etching dielectric layer 122. The anisotropic etch of dielectric layer 122 results in the formation of spacer structures 125 having an outer surface 124 comprised of an oxidation inhibiting material such as silicon nitride. Although the presently preferred embodiment of spacer structures 125 includes the formation of first spacer structure 120, an alternative embodiment could exclude the formation of first spacer structure 120 such that spacer structure 125 would consist entirely of spacer structure 124. In either case, spacer structure 125 includes an outer surface 124 comprising an oxidation inhibiting material. Alternatively, the spacer structure could be formed entirely of oxide as shown previously in FIG. 3. In such an embodiment, deposition of a second dielectric layer 122 would be eliminated. Spacer structure 125 extends outward from sidewall 116 to shadow peripheral portions 105 of channel region 106. The distance $d_2$ between an outer surface of first spacer structure 125a and second spacer structure 125b, is less than the minimum feature size resolvable by photolithography exposure device.

Figure 6:
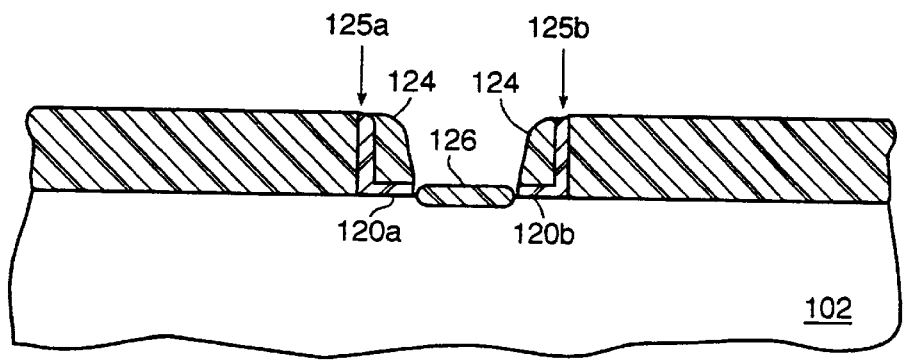
FIG. 6 is a processing step subsequent to FIG. 5 in which a channel dielectric has been formed between the opposing spacer structures.
Figure 7:
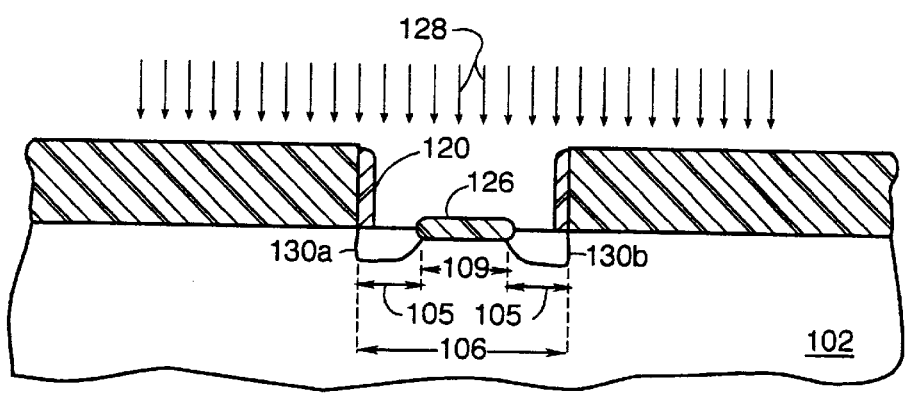
FIG. 7 is a processing step subsequent to FIG. 6 in which the oxidation inhibiting outer surface of the spacer structures has been removed and a first species implanted into peripheral portions of the channel region.

Turning now to FIG. 6, a channel dielectric 126 is formed between first and second spacer structures 125a and 125b. In one embodiment of the present invention, channel dielectric 126 is formed by exposing semiconductor substrate 102 to a thermal oxidation process. Because outer surfaces 124 of spacer structures 125 comprise an oxidation inhibiting material, channel dielectric 126 will form between, but not upon, spacer structure 125. Turning to FIG. 7, outer surface 124 of spacer structure 125 is removed and a first species 128 is introduced into peripheral regions 105 of channel region 106. In an embodiment in which outer surface 124 comprises silicon nitride, removal of the silicon nitride can be accomplished with a 85% phosphoric acid solution heated to approximately 180° C. In an embodiment in which the space structures are comprised of oxide or a silicon-oxynitride film, the entire spacer structure is removed prior to the first implant. Preferably, introduction of first species 128 into semiconductor substrate 102 is accomplished with an ion implantation. In one embodiment, a first concentration of first species 128 is introduced into semiconductor substrate 102 to form LDD regions 130. The presence of channel dielectric 126 prevents first species 128 from occurring in the interior region 109 of channel 106. First species 128 is preferably comprised of one of the elements commonly used in semiconductor processing for the formation of source/drain regions namely, boron, phosphorus, and arsenic. The lateral distance 109 between first LDD region 130a and second LDD region 130b is less than the lateral dimension of channel region 106 which is, in one embodiment, approximately equal to the minimum feature size resolvable by the photolithography exposure equipment.

Figure 8:
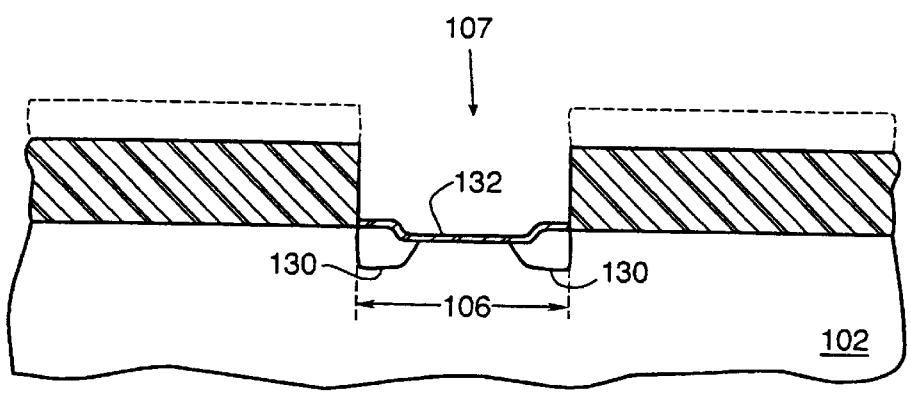
FIG. 8 is a processing step subsequent to FIG. 7 in which the channel dielectric has been removed and a gate dielectric formed upon the channel region.
Figure 9:
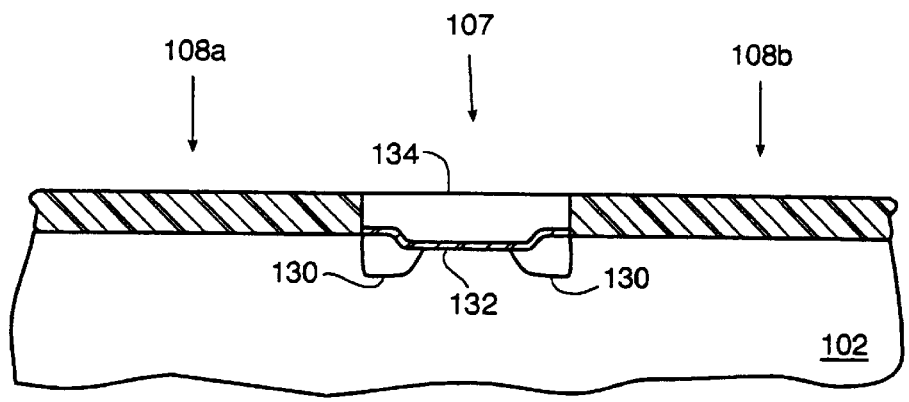
FIG. 9 is a processing step subsequent to FIG. 8 in which a conductive gate structure has been formed over the gate dielectric.
Figure 10:
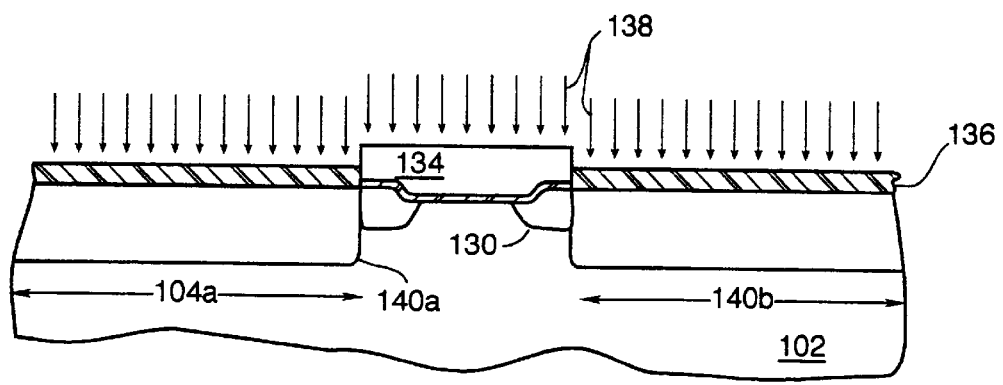
FIG. 10 is a processing step subsequent to FIG. 9 in which the first and second dielectric structures have been removed and a second impurity introduced into the source/drain regions of the semiconductor substrate.

Turning now to FIG. 8, channel dielectric 126 and spacer structure 120 have been removed and a gate dielectric structure 132 has been formed on an upper surface of channel region 106. Gate dielectric 132 is preferably comprised of a thermal oxide having a thickness of 30–300 angstroms. Turning to FIG. 9, a conductive gate structure 134 is formed over gate dielectric 132. In the presently preferred embodiment, conductive gate structure 134 is formed by depositing a layer of polysilicon on the topology defined by first dielectric structure 108a, gate dielectric 132, and second dielectric 108b. The polysilicon layer is preferably doped, either in situ or with an implant, to form an electrically conductive layer. Thereafter, excess polysilicon material is removed from regions exterior to the trench 107 with a planarization process. The planarization process preferably comprises a chemical-mechanical polish. In an embodiment not shown in the drawings, a dielectric layer may be formed on an upper surface of the conductive gate structure 134. Turning now to FIG. 10, source/drain regions 140a and 140b are formed by introducing a second concentration of a second impurity into source/drain regions 104a and 104b of semiconductor substrate 102. Introduction of second species 138 into source/drain regions 104 of semiconductor substrate 102 is preferably accomplished with an ion implantation after removal of first dielectric structure 108a anpreecond dielectric structure 108b. In the presently preferred embodiment, the first concentration of first species 128 comprises phosphorous at approximately $5\times10^{12}$ to $1\times10^{14}$ cm$^{-2}$ while the second concentration of second species 138 comprises arsenic at approximately $1\times10^{15}$ to $5\times10^{15}$ cm$^{-2}$. Dielectric structures 108 are preferably removed with an etch step selective to conductive gate 134. In the embodiment shown in FIG. 10, an implant oxide layer 136 is used to minimize the lattice damage to semiconductor substrate 102 resulting from implant 138. Implant oxide 136, in one embodiment, can be formed by incompletely removing dielectric structures 108. Alternatively, dielectric structure 108 can be completely removed and implant oxide 136 can be thereafter deposited or thermally formed. In yet another embodiment, second species 138 is implanted into substrate 102 without the use of an implant dielectric 136 (i.e. implanted into bare silicon).

It will be appreciated to those skilled in the art having the benefit of this disclosure that this invention is capable of forming a transistor having an effective channel length which is substantially less than the minimum feature size resolvable by the photolithography exposure equipment used in the process. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

We claim:

1. A method of fabricating a transistor, comprising the steps of:

providing a semiconductor substrate, wherein said semiconductor substrate includes a channel region laterally displaced between a first source/drain region and a second source/drain region;

forming first and second dielectric structures on an upper surface of said semiconductor substrate such that said first and second dielectric structures are aligned with said first and second source/drain regions respectively and wherein each said first and second dielectric structure includes a substantially vertical sidewall proximal to said channel region;

forming first and second spacer structures on said vertical sidewalls of said first and second dielectric structures respectively, each of said spacer structures including an outer surface and said spacer structures shadowing portions of said channel region proximal to said source/drain regions, wherein forming said first and second spacer structures comprises depositing a dielectric layer on said vertical sidewalls of said first and second dielectric structures respectively;

forming a channel dielectric structure laterally displaced between said first and second spacer structures;

removing said outer surface of each said spacer structure to expose peripheral portions of said channel region proximal to said source/drain regions;

introducing a first concentration of a first impurity into said peripheral portions of said channel region;

removing said channel dielectric;

forming a gate dielectric over said channel region;

forming a conductive gate structure over said gate dielectric;

removing said first dielectric structure and said second dielectric structure to expose said source/drain regions; and introducing a second impurity, at a second concentration, into said source/drain regions.

2. The method of claim 1 wherein the step of forming said first and second dielectric structures includes:

forming a layer of oxide on said semiconductor substrate;

depositing a photoresist layer on an upper surface of said layer of oxide;

patterning said photoresist layer to expose said oxide layer over said channel region of said semiconductor substrate;

etching said oxide layer over said channel region; and stripping said photoresist layer.

3. The method of claim 1 wherein the step of forming said first and second spacer structures comprises:

depositing said dielectric layer on a topography defined by an upper surface of said first and second dielectric structures and said channel region; and anisotropically etching said dielectric layer.

4. The method of claim 1 wherein said spacer structures comprise an oxide.

5. The method of claim 1 wherein said spacer structures comprise silicon oxynitride.

6. The method of claim 1 wherein each said outer surface of each said spacer structure comprises an oxidation inhibiting material.

7. The method of claim 6 wherein said oxidation inhibiting outer surface of each said spacer structure comprises silicon nitride and wherein the step of removing said outer surface comprises immersing said semiconductor substrate an approximately 85% phosphoric acid solution at approximately 180° C.

8. The method of claim 1 wherein the step of forming a channel dielectric structure comprises thermally oxidizing said channel region between said shadowed regions of said semiconductor substrate.

9. The method of claim 8 wherein the step of removing said channel dielectric comprises wet etching said channel dielectric in an HF solution.

10. The method of claim 1 wherein the step of introducing said first impurity into said peripheral portions of said channel region comprises ion implanting an atomic species selected from the group consisting of boron, arsenic, and phosphorous.

11. The method of claim 1 wherein the step of forming said conductive gate structure includes:

depositing a polysilicon layer on the topology formed by an upper surface of said first and second dielectric structures and said gate dielectric; and planarizing said polysilicon layer to remove said polysilicon layer external to a trench defined by said first and second sidewalls and said gate dielectric.

12. The method of claim 11 wherein the step of planarizing said polysilicon layer comprises chemically mechanically polishing said polysilicon layer.

13. The method of claim 1 wherein the step of introducing said second impurity into said source/drain region comprises implanting said second impurity into said source/drain regions and wherein said second impurity is selected from the group consisting of boron, arsenic, and phosphorous.

14. The method of claim 13 wherein said second impurity comprises phosphorous and said second concentration is approximately $5\times10^{15}$ cm$^{-2}$.

15. A method of fabricating a transistor, comprising:

providing a semiconductor substrate;

forming a dielectric layer on an upper surface of said semiconductor substrate;

depositing a photoresist layer on said dielectric layer;

patterning said photoresist layer with a photolithography exposure device to expose a region of said dielectric layer, wherein said exposed region of said dielectric layer has a lateral dimension approximately equal to a minimum feature size which can be resolved by said photolithographic exposure device;

removing said exposed region of said dielectric layer such that first and second dielectric sidewalls are formed and whereby a channel region of said semiconductor substrate having a lateral dimension approximately equal to said minimum feature size is exposed;

forming first and second spacer structures on said first and second dielectric sidewalls respectively such that said first and second spacer structures shadow peripheral portions of said channel region whereby an exposed portion of said channel region has a lateral dimension less than said minimum feature size and wherein each said spacer structure includes an outer surface;

forming a channel dielectric structure between said first and second spacer structures;

removing said outer surface of said first and second spacer structures to expose said peripheral portions of said exposed region semiconductor substrate;

subsequent to said removing said outer surface of said first and second spacer structures, introducing a first concentration of phosphorous into said peripheral portions of said channel region before performing any additional introductions of impurities into said peripheral portions;

subsequent to said introducing a first concentration of phosphorous, removing said channel dielectric before performing any additional introductions of impurities into said peripheral portions;

forming a gate dielectric on said channel region;

forming a conductive gate structure over said gate dielectric;

removing said dielectric layer to expose said source/drain regions; and introducing a second concentration of arsenic into said source/drain regions.

16. The method of claim 15 wherein said dielectric layer comprises a deposited oxide.

17. The method of claim 15 wherein said outer surface of said spacer structure comprise silicon nitride.

18. The method of claim 15 wherein the step of introducing a first concentration of phosphorous comprises implanting said phosphorous, and wherein said first concentration is approximately equal to $5\times10^{12}$ cm$^{-2}$.

19. The method of claim 15 wherein the step of introducing a second concentration of arsenic comprises implanting said arsenic, and wherein said second concentration is approximately equal to $5\times10^{15}$ cm$^{-2}$.

20. A method of fabricating a transistor, comprising the steps of:

providing a semiconductor substrate, wherein said semiconductor substrate includes a channel region laterally displaced between a first source/drain region and a second source/drain region;

forming a first and second dielectric structure on an upper surface of said semiconductor substrate such that said first and second dielectric structures are aligned with said first and second source/drain regions respectively and wherein each said first and second dielectric structure includes a substantially vertical sidewall proximal to said channel region;

forming first and second spacer structures on said vertical sidewalls of said first and second dielectric structures respectively, each said spacer structure including an outer surface and said spacer structures shadowing portions of said channel region proximal to said source/drain regions, wherein forming said first and second spacer structures comprises depositing a dielectric layer on said vertical sidewalls of said first and second dielectric structures respectively;

forming a channel dielectric structure laterally displaced between said first and second spacer structures;

removing said outer surface of each said spacer structure to expose peripheral portions of said channel region proximal to said source/drain regions;

subsequent to said removing said outer surface of each said spacer structure, introducing a first concentration of a first impurity into said peripheral portions of said channels region before performing any additional introductions of impurities into said peripheral portions;

subsequent to said introducing a first concentration of a first impurity, removing said channel dielectric before performing any additional introductions of impurities into said peripheral portions;

forming a gate dielectric over said channel region;

forming a conductive gate structure over said gate dielectric;

removing said first dielectric structure and said second dielectric structure to expose said source/drain regions; and introducing a second impurity, at a second concentration, into said source/drain regions.

* * * * *

UNITED STATES PATENT AND TRADEMARK OFFICE
CERTIFICATE OF CORRECTION

PATENT NO. : 5,918,134
DATED : June 29, 1999
INVENTOR(S) : Gardner et al.

It is certified that error appears in the above-identified patent and that said Letters Patent is hereby corrected as shown below:

Claim 14, col. 9, line 6, after the phrase "approximately $5 \times 10^{15}$ cm$^{-2}$" please insert --, and said implanting said second impurity is performed at an energy of approximately 60 KeV--

Signed and Sealed this

First Day of February, 2000

Attest:

Attesting Officer

Q. TODD DICKINSON

Acting Commissioner of Patents and Trademarks